United States Patent
Peng (10) Patent No.: US 9,651,812 B1
(45) Date of Patent: May 16, 2017

(54) PARTIALLY FILLED CONTACT AND TRACE LAYOUT

(75) Inventor: Tao Peng, Shanghai (CN)

(73) Assignee: Cypress Semiconductor Corporation, San Jose, CA (US)

( * ) Notice: Subject to any disclaimer, the term of this patent is extended or adjusted under 35 U.S.C. 154(b) by 728 days.

(21) Appl. No.: 12/902,958

(22) Filed: Oct. 12, 2010

Related U.S. Application Data (60) Provisional application No. 61/266,721, filed on Dec. 4, 2009.

(51) Int. Cl.
*G02F 1/1335* (2006.01)
*G02F 1/1333* (2006.01)
*G06F 3/041* (2006.01)

(52) U.S. Cl.
CPC .......... *G02F 1/13338* (2013.01); *G06F 3/041* (2013.01)

(58) Field of Classification Search
CPC .......... G02F 1/13338; G06F 3/041; B41J 2/01
USPC ..................... 349/12; 345/173–183
See application file for complete search history.

(56) References Cited

U.S. PATENT DOCUMENTS

| | | | |
|---|---|---|---|
| 6,445,426 B1* | 9/2002 | Kang et al. | 349/12 |
| 8,400,418 B2* | 3/2013 | Matsuo | 345/174 |
| 2006/0132462 A1* | 6/2006 | Geaghan | 345/173 |
| 2006/0250373 A1* | 11/2006 | Sakurai et al. | 345/173 |
| 2007/0062739 A1* | 3/2007 | Philipp et al. | 178/18.06 |
| 2007/0126707 A1* | 6/2007 | Jones | 345/173 |
| 2008/0062140 A1 | 3/2008 | Hotelling et al. | |
| 2009/0002337 A1* | 1/2009 | Chang | 345/174 |
| 2010/0123670 A1* | 5/2010 | Philipp | 345/173 |
| 2010/0136868 A1* | 6/2010 | Chien et al. | 445/24 |
| 2010/0214233 A1* | 8/2010 | Lee | G06F 3/044 345/173 |
| 2011/0007011 A1* | 1/2011 | Mozdzyn | 345/173 |
| 2011/0115717 A1* | 5/2011 | Hable et al. | 345/173 |

FOREIGN PATENT DOCUMENTS

| | | |
|---|---|---|
| CN | 21212990 Y | 3/2009 |
| EP | 2012169 A2 | 1/2009 |
| EP | 2053495 A2 | 4/2009 |
| EP | 2053496 A2 | 4/2009 |
| EP | 2066162 A1 | 6/2009 |
| EP | 2096525 A2 | 9/2009 |
| EP | 2116885 A2 | 11/2009 |
| JP | 2005268632 A2 | 9/2005 |
| WO | 2009126480 A3 | 12/2009 |

* cited by examiner

*Primary Examiner* — Charles Chang (57) ABSTRACT

An apparatus including a first layer formed from a first conductive material having a first coefficient of thermal expansion and a second layer, coupled to the first layer, the second layer formed from a second conductive material having a second coefficient of thermal expansion, where the second layer is partially filled.

19 Claims, 7 Drawing Sheets

PARTIALLY FILLED CONTACT AND TRACE LAYOUT

RELATED APPLICATIONS

This application claims the benefit of U.S. Provisional Application No. 61/266,721 filed on Dec. 4, 2009, which is hereby incorporated by reference herein.

TECHNICAL FIELD

This disclosure relates to the field of integrated circuits and, in particular, to a partially filled contact and trace layout between layers of conductive materials.

BACKGROUND

An electrical signal flows through conductive materials as a current. In certain cases, the current may flow from one conductive material into another at a junction, or contact, between the materials. Resistance to the flow of current is inversely proportional to area. Thus, in order to minimize resistance and maximize the current flow from one material into the other, the contact area, or overlap, between the two materials is as large as possible.

All materials change their size when subjected to a change in temperature. A property known as the coefficient of thermal expansion describes how the size of an object changes in response to a change in temperature. Specifically, it measures the fractional change in size per degree change in temperature. Different materials have different coefficients of thermal expansion and thus, react differently (i.e., the sizes change by different amounts) when subjected to a temperature change. Generally, the change in area can be expressed as $\Delta A/A = \alpha_A \cdot \Delta T$, where A is the area, $\alpha_A$ is the thermal expansion coefficient, and T is the temperature.

In certain cases, two layers of different materials having different coefficients of thermal expansion may be overlapped in an area in order to allow current to flow between the materials. As the temperature changes, the two materials may expand or contract at a different rates. At a certain point, a shear force formed by the changes in size may cause bonds between the materials to break, resulting in one material peeling away from the other. The larger the area of overlap between the materials, the stronger that force becomes, resulting in the materials peeling apart more easily. Thus, in order to prevent the materials from coming apart the area of overlap is small. This is in conflict with the large size used to lower resistance. Thus, circuit designers face a dilemma when trying to balance a large contact area to reduce resistance and a small contact area to prevent separation due to thermal expansion.

BRIEF DESCRIPTION OF THE DRAWINGS

The present disclosure is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Embodiments are described for a partially filled contact and trace layout between two layers of conductive materials. In one embodiment, a two layer structure is formed with two layers of different conductive materials. The first layer is formed from a first conductive material having a first coefficient of thermal expansion and the second layer is formed from a second conductive material having a second coefficient of thermal expansion. The two layers have at least some area of contact or overlap. In one embodiment the contact represents an ohmic contact so that electric current, representing an electronic signal, may flow between the layers in the area of overlap. One of the layers (e.g., the second layer) is only partially filled in the area of contact. The partial fill reduces the surface area of the second layer that is in contact with the first layer to prevent shear forces from pulling the layers apart due to thermal expansion. The surface area of the second layer remains large enough, however, to maintain a low resistance for an electric current flowing between the first and second layers of conductive material. In one embodiment the coefficients of thermal expansion for each layer are different, however, in other embodiments, the coefficients of thermal expansion may be the same.

Figure 1A:
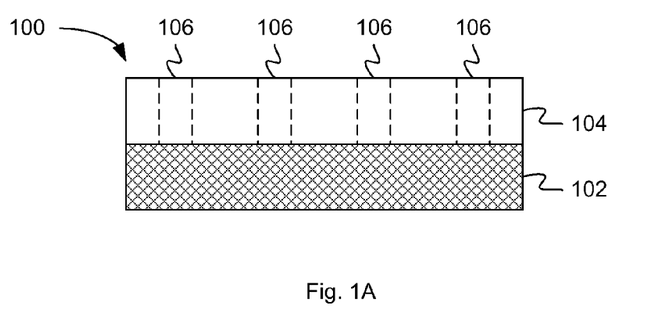
FIG. 1A is a block diagram illustrating a cross sectional view of a two layer structure of conductive materials with partially filled contact, according to an embodiment.

FIG. 1A is a block diagram illustrating a cross sectional view of a two layer structure 100 of conductive materials with partially filled contact, according to an embodiment. Structure 100 includes first layer 102 and second layer 104. In this embodiment, the surface area of at least one layer (i.e., second layer 104) completely overlaps with the surface area of the other layer (i.e., first layer 102). The area of contact between first layer 102 and second layer 104 is only partially filled. In this embodiment, the partial fill is accomplished by second layer 104 having a plurality of open voids 106 which extend through second layer 104. In the cross sectional view of FIG. 1A, the voids 106 are shown by dotted lines extending through second layer 104. Second layer 104 does not contact first layer 102 in the areas with voids 106, limiting the area of contact to the surface area of second layer 104 around the voids 106.

Figure 1B:
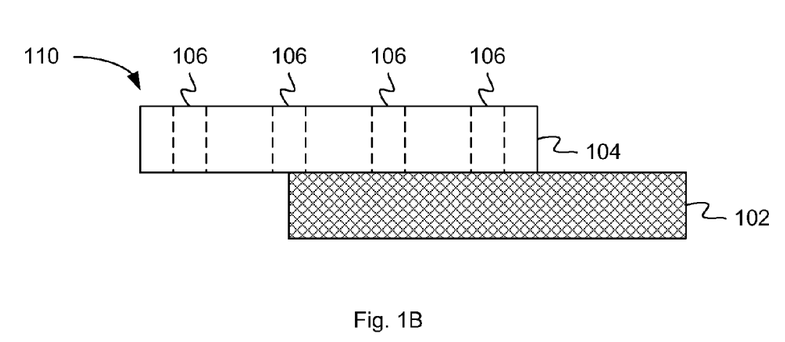
FIG. 1B is a block diagram illustrating a cross sectional view of an offset two layer structure of conductive materials with partially filled contact, according to an embodiment.

FIG. 1B is a block diagram illustrating a cross sectional view of an offset two layer structure 110 of conductive materials with partially filled contact, according to an embodiment. In structure 110, first layer 102 and second layer 104 are offset, such that only a portion of the surface area of at least one layer (i.e., second layer 104) overlaps with the surface area of the other layer (i.e., first layer 102). Similarly to structure 100, the area of contact is only partially filled, as second layer 104 has a plurality of voids 106.

Figure 1C:
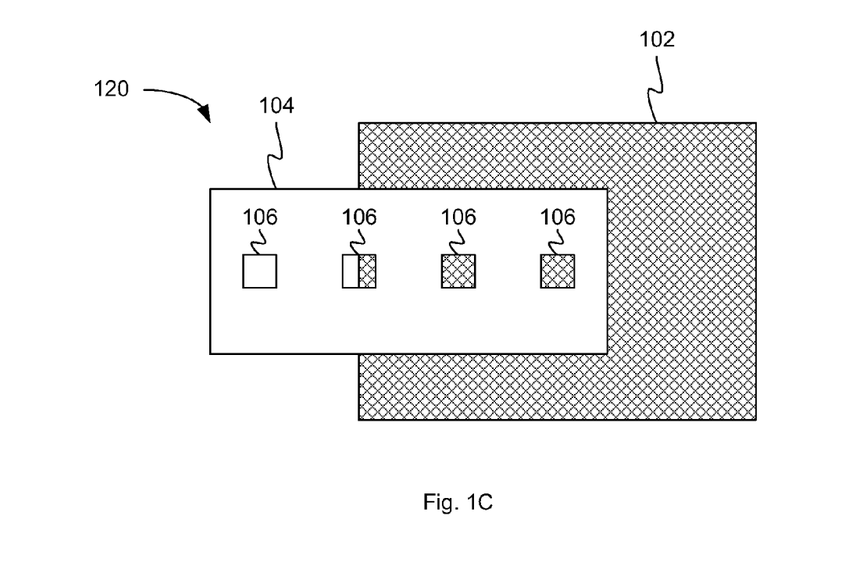
FIG. 1C is a block diagram illustrating a top view of an offset two layer structure of conductive materials with partially filled contact, according to an embodiment.

FIG. 1C is a block diagram illustrating a top view of an offset two layer structure 120 of conductive materials with partially filled contact, according to an embodiment. Similarly to structure 110, in structure 120, first layer 102 and second layer 104 are offset, such that only a portion of the surface area of second layer 104 overlaps with the surface area of first layer 102. In the top view of FIG. 1C, it is shown that second layer 104 does not contact first layer 102 in the areas of voids 106.

In any of the embodiments shown in FIGS. 1A-1C, first layer 102 and second layer 104, may be formed from different conductive materials. In some embodiments, a current may flow through the conductive materials (e.g., from first layer 102 into second layer 104 or from second layer 104 into first layer 102). Since resistance to the flow of the current is decreased as the surface area of contact between the two materials goes up, it is desirable to have the contact area, or overlap, between the two materials be as large as possible. Each of the conductive materials, however, may have a different coefficient of thermal expansion. The coefficient of thermal expansion defines how the size of the material will change with respect to a change in temperature. As the temperature changes, the two materials may expand or contract by different amounts and/or at a different rates. At a certain point, a shear force formed by the changes in size may cause bonds between the materials to break, resulting in one material peeling away from the other. Since that force is stronger when the area of overlap between the materials is large, it is desirable to have the area of overlap be smaller. The partially filled contact formed with voids 106 in second layer 104 reduces the surface area of contact between first layer 102 and second layer 104 to prevent separation while leaving sufficient surface area of contact to maintain a low resistance to current flow.

Figure 2:
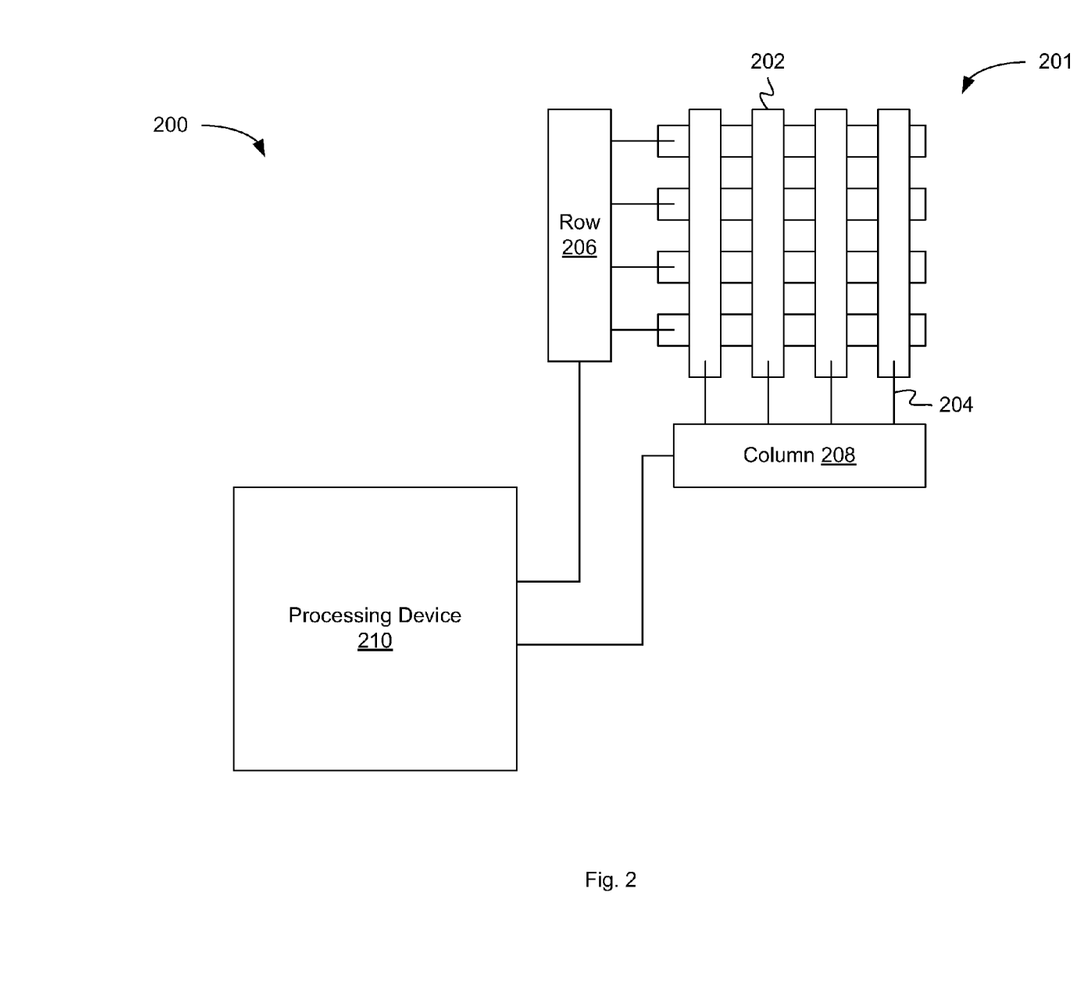
FIG. 2 is a block diagram illustrating an electronic system for a touch sensor device, according to an embodiment.

FIG. 2 is a block diagram illustrating an electronic system for a touch sensor device, according to an embodiment. System 200 includes a touch sensor panel 201 and processing device 210. Touch sensor panel 201 may sense a touch and send signals to processing device 210 to perform an action in response to the touch. Touch sensor panel 201, may be for example, a resistive or capacitive touch screen. A resistive touch screen generally is made from two layers of transparent conductive material, such as Indium Tin Oxide (ITO), separated by air. A touch is detected when the top layer deflects into contact with the bottom layer. A current running through the conductive material is passed through a trace to processing device 210 which identifies the signal as a touch on the touch screen. For a capacitive touch screen, the touch sensor 201 may be a grid-like pattern of sensor elements (e.g., capacitive elements) used in conjunction with the processing device 210 to detect a presence and position of a conductive object, such as a finger. The capacitive elements 202 may be formed from a conductive material, such as ITO, and may each be coupled to row drive/sensing circuit 206 or a column drive/sensing circuit 208 through traces 204. Processing device 210 may identify the presence and/or position of the conductive object based on signals received from the capacitive elements 202. Traces 204 may be formed from a variety of metals, such as for example, copper or other materials.

The junction between capacitive element 202 and trace 204 may be similar to the junction of first material 102 and second material 104, discussed above with respect to FIGS. 1A-1C. In one illustrative example, capacitive element 202 is formed from ITO and trace 204 is formed from copper. The ITO and copper overlap to form a junction. In one embodiment, the area of overlap between the ITO and copper is partially filled to achieve a balance between low resistance to the flow of current between the ITO and copper and preventing separation due to the different amounts of thermal expansion of the two materials. In one embodiment, one layer of the touch sensor panel may be formed from a transparent conductive material, such as ITO or other material.

FIGS. 3A-3H are block diagrams illustrating a top view of a two layer structure of conductive materials with partially filled contact, according to embodiments. The embodiments illustrated herein may be any two layer structure of conductive materials, where the materials have different coefficients of thermal expansion. In one embodiment, the layers may include an ITO layer and a metal layer (e.g., copper), which form part of a touch panel. For purposes of illustration, the partial fill contact is shown with open voids in one of the two layers. It should be understood, however, that either of the two layers, or both, may include voids which extend either partially or completely through the material. The shape, size and arrangement of the voids may vary in different situations, and the embodiments shown in FIGS. 3A-3H are merely examples and should not be construed as the only possible formats. Any shape, size or arrangement where the voids represent at least approximately 25% of a total surface area if the layer were solid may be used. In other words, the actual surface area of the second layer that is in contact with the adjacent first layer is approximately three times greater than a second surface area represented by the plurality of open voids in the second layer. In one embodiment, the voids are arranged so that they are distributed evenly throughout the surface area of contact with the adjacent layer. This even distribution limits the size of the contact area in any one local region, preventing large aggregations of surface area, and reduces the negative effects of shear forces. In certain embodiments, the voids may represent the majority of the total surface area and may represent up to, but not including 100% of the total surface area. In another embodiment, the voids are distributed unevenly throughout the surface area of contact with the adjacent layer.

Figure 3A:
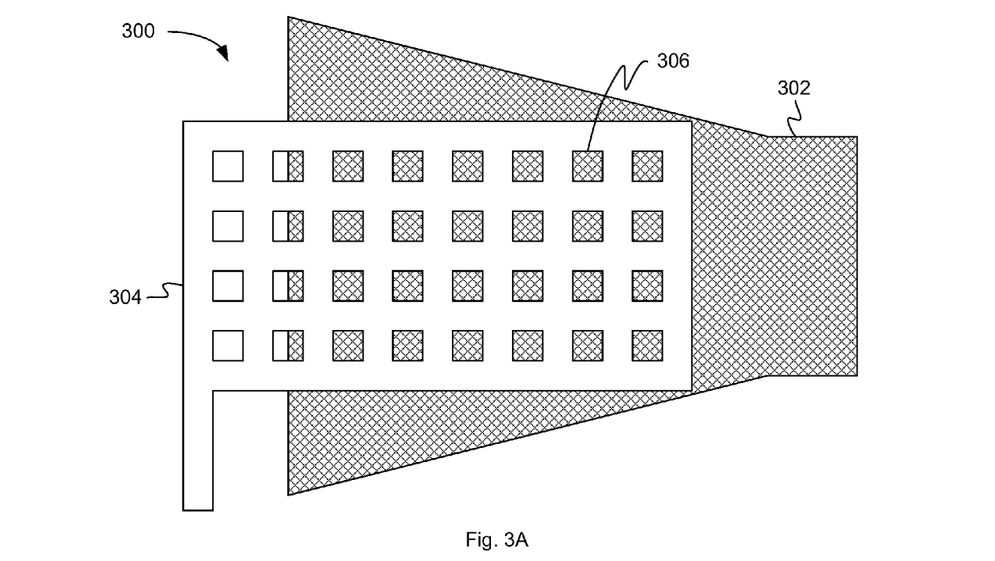
FIGS. 3A-3H are block diagrams illustrating a top view of a two layer structure of conductive materials with partially filled contact, according to embodiments.
Figure 3B:
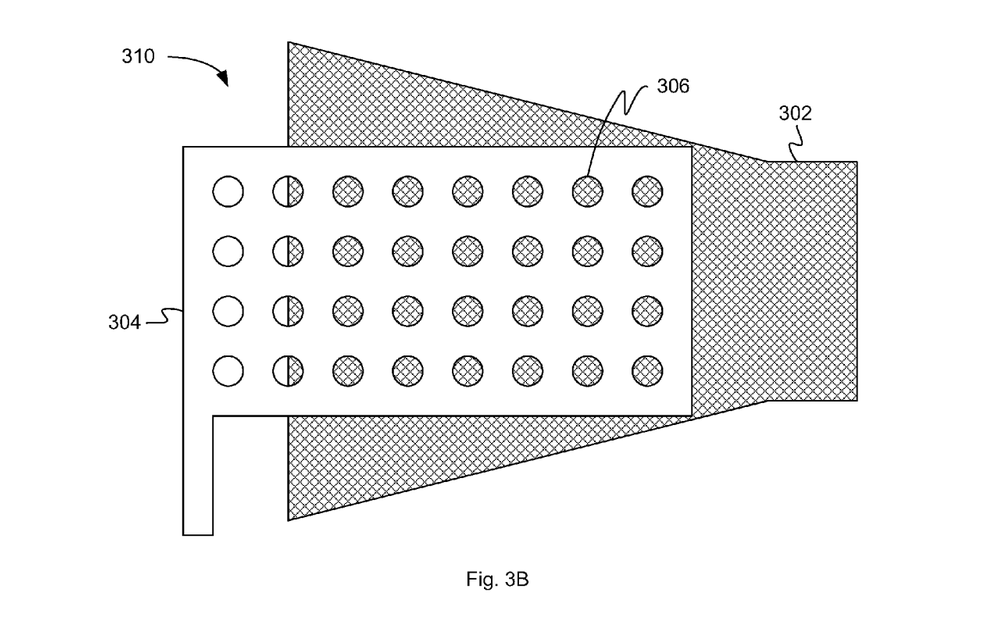
Figure 3C:
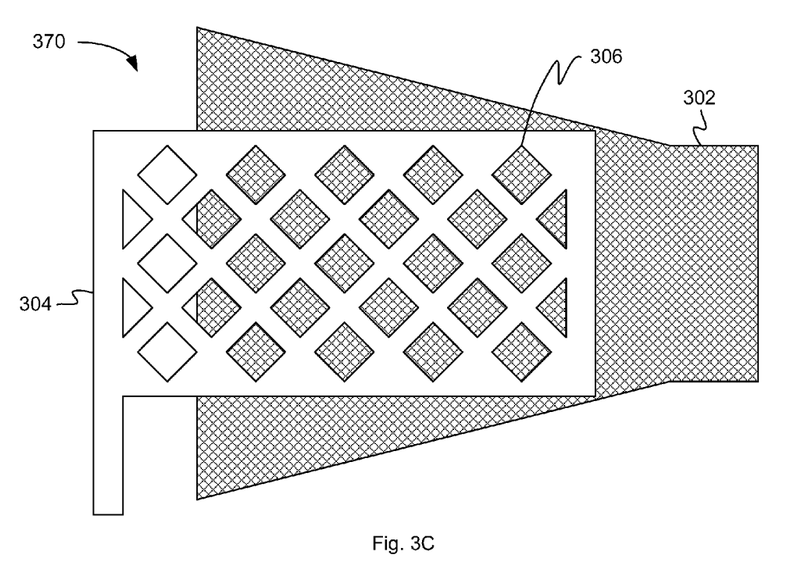

FIG. 3A is a block diagram illustrating a top view of a two layer structure 300 of conductive materials with partially filled contact, according to an embodiment. In this embodiment, first layer 302 is a solid layer and second layer 304 partially overlaps first layer 302. In one embodiment, first layer 302 may be a capacitive element formed from ITO and second layer 304 may be a metal trace. In this embodiment, the contact area between first layer 302 and second layer 304 is partially filled, in that second layer 304 includes a plurality of open voids 306 extending through the second layer 304. In this embodiment, voids 306 are rectangular holes cut or punched through second layer 304. In other embodiments, the voids 306 may have other shapes, such as for example, circles as shown in FIG. 3B, diamonds as shown in FIG. 3C, or other shapes. The voids 306 are all of equal size and shape and may be evenly distributed throughout the surface area of second layer 304. In other embodiments, however, the voids 306 have different sizes, shapes, positions and/or arrangements.

Figure 3D:
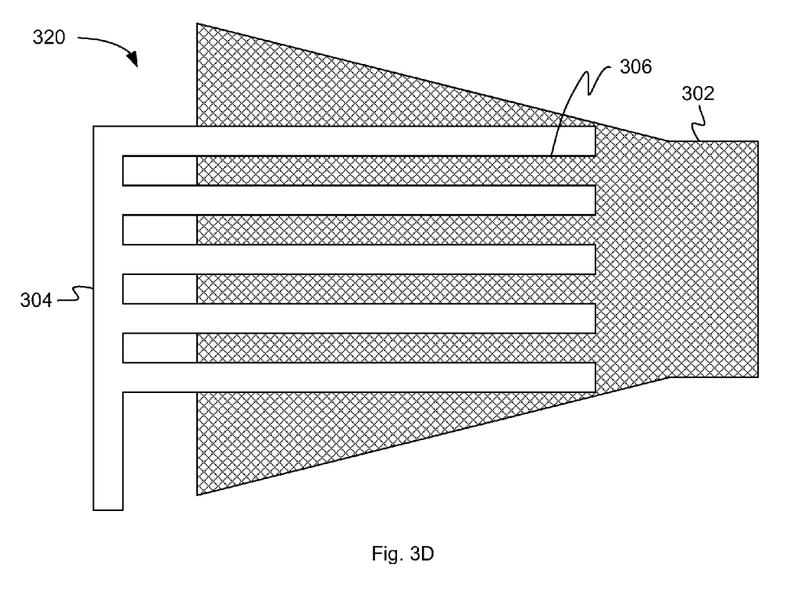
Figure 3E:
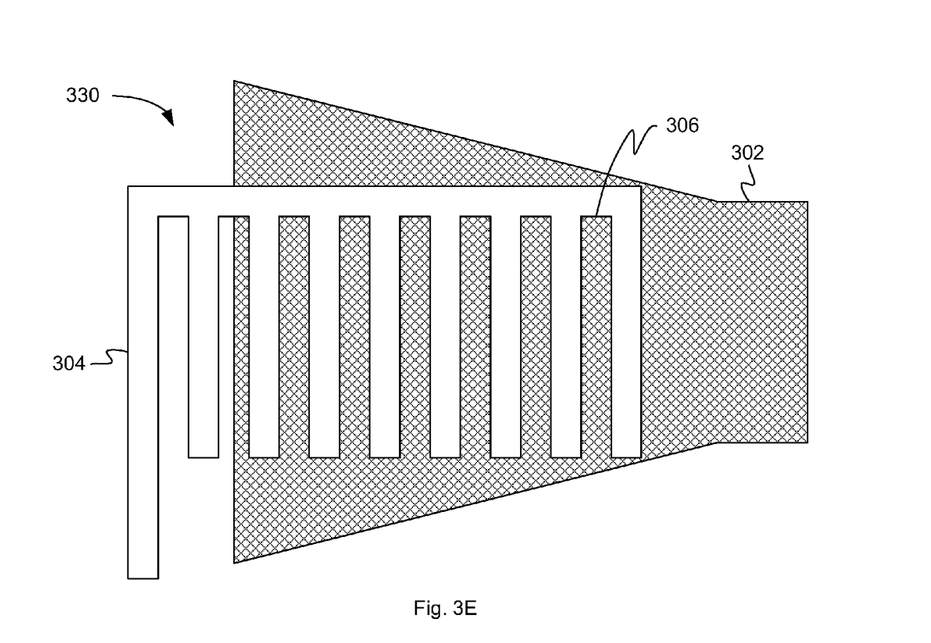
Figure 3F:
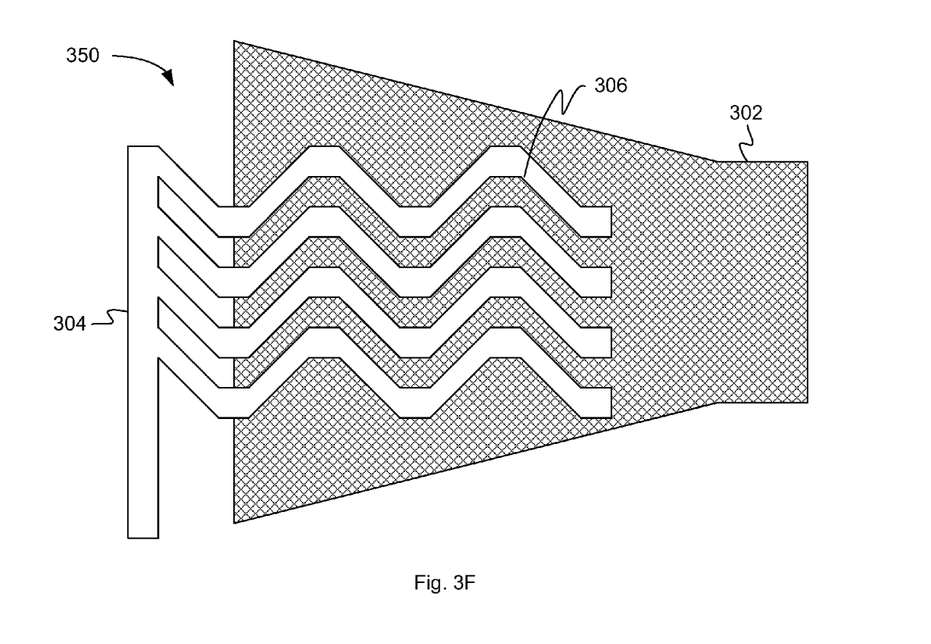

FIG. 3D is a block diagram illustrating a top view of a two layer structure 320 of conductive materials with partially filled contact, according to an embodiment. In this embodiment, first layer 302 is a solid layer and partially filled second layer 304 includes a first plurality of substantially parallel strips. The second layer 304 has a void 306 between each of the plurality of strips. In this embodiment, the parallel strips of second layer 304 have a substantially horizontal alignment, however in other embodiments, the parallel strips may have some other alignment, such as for example, substantially vertical as shown in FIG. 3E, or some other angle of alignment. In this embodiment, the parallel strips and voids 306 are rectangular in shape, are all of equal width and may be evenly distributed through the surface area of second layer 304. In other embodiments, however, the parallel strips and/or voids 306 may have different widths, shapes, positions and/or arrangements. In still other embodiments, the strips may not be parallel, but may instead have a zig-zag or other shape, as shown in FIG. 3F.

Figure 3G:
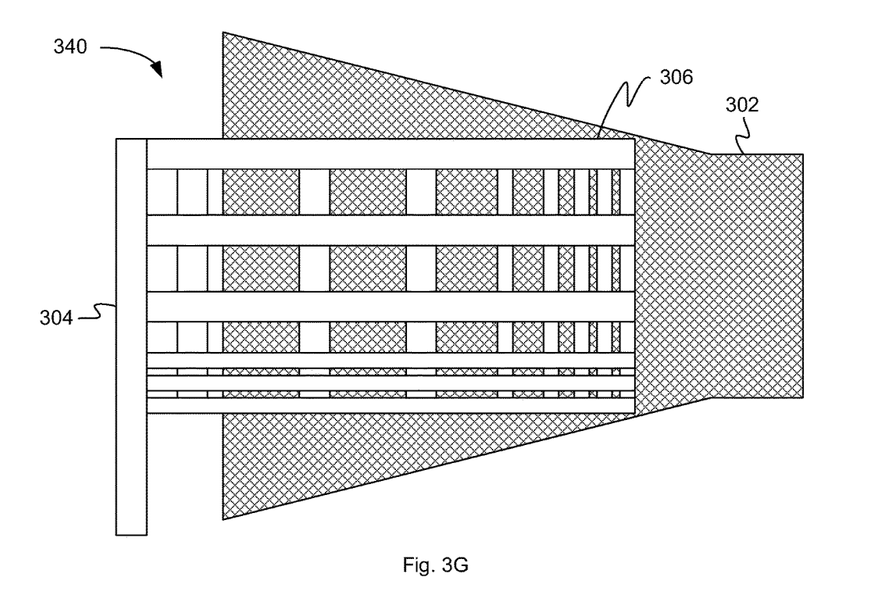
Figure 3H:
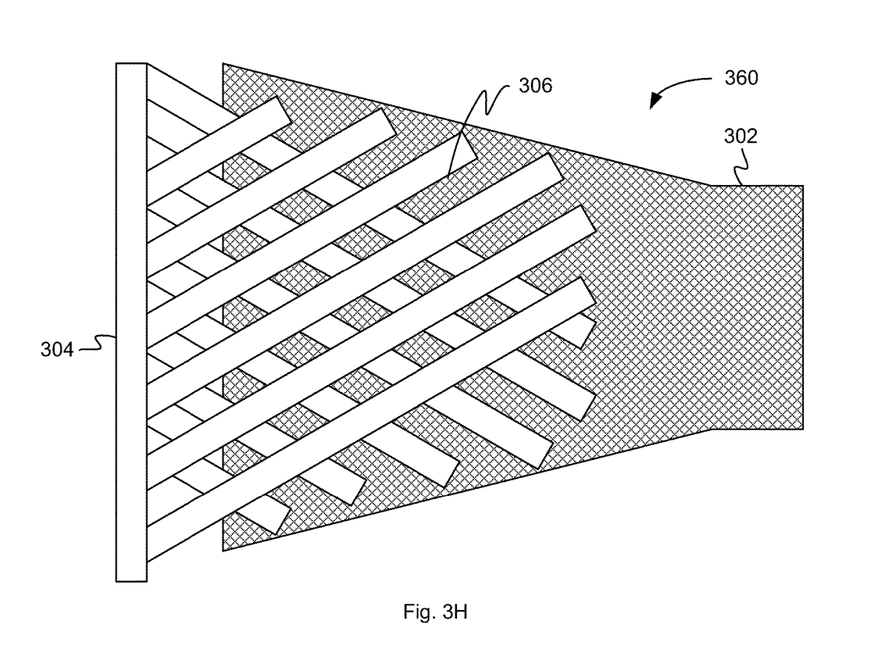

FIG. 3G is a block diagram illustrating a top view of a two layer structure 340 of conductive materials with partially filled contact, according to an embodiment. In this embodiment, first layer 302 is a solid layer and partially filled second layer 304 includes a first plurality of substantially parallel strips, with a void 306 between the first plurality of strips, and a second plurality of substantially parallel strips, with a void 306 between the second plurality of strips. The second plurality of strips is oriented at a degree of rotation in relation to the first plurality of strips. In certain embodiments, the degree of rotation may be for example, 90°, as shown in FIG. 3G, 45°, or some other degree of rotation, as shown in FIG. 3H. In one embodiment, the the voids 306 are distributed throughout the second layer 304 in an uneven distribution. The uneven distribution may form any pattern, one example of which is illustrated in FIG. 3G. In one embodiment, the first and second pluralities of strips are overlaid on top of one another, as shown in FIG. 3H, but are thin enough to effectively form a single layer. In one embodiment, the parallel strips and voids 306 are rectangular in shape, are all of equal width and may be evenly distributed through the surface area of second layer 304. In other embodiments, however, the parallel strips and/or voids 306 may have different widths, shapes, positions and/or arrangements.

Figure 4:
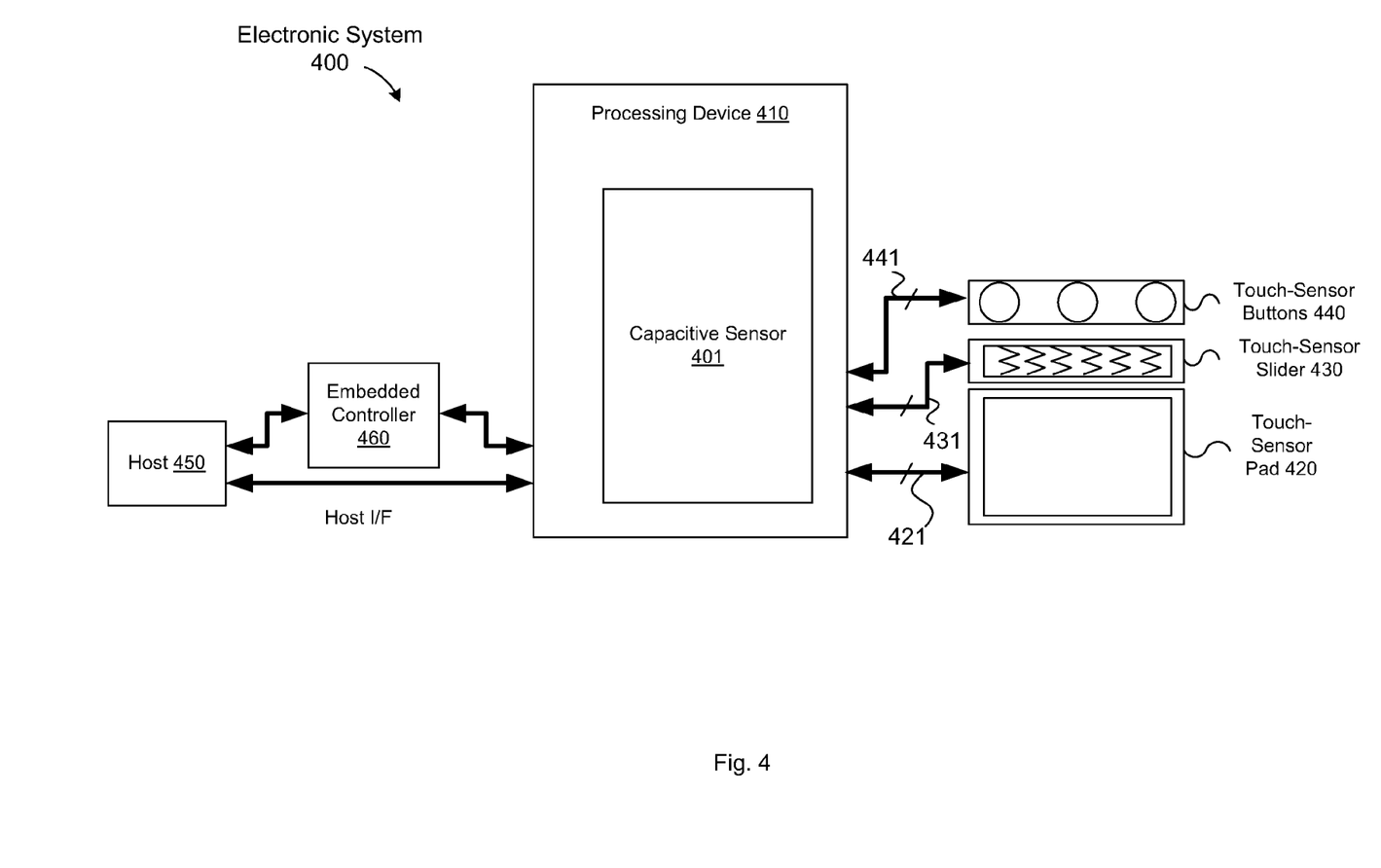
FIG. 4 illustrates a block diagram of an electronic system having a processing device for storing charge from a mutual or self capacitance sensor, according to an embodiment.

FIG. 4 illustrates a block diagram of one embodiment of an electronic system having a processing device for detecting a presence of a conductive, charged, or polarized object. For purposes of illustration and not limitation, electronic system 400 can include, for example, processing device 410, touch-sensor pad 420, touch-sensor slider 430, touch-sensor buttons 440, host processor 450, and embedded controller 460.

As illustrated, capacitive sensor 401 may be integrated into processing device 410. Capacitive sensor 401 may include analog I/O for coupling to an external component, such as touch-sensor pad 420, touch-sensor slider 430, touch-sensor buttons 440, and/or other devices.

It should be noted that the embodiments described herein are not limited to touch-sensor pads for notebook implementations, but can be used in any other suitable type of capacitive sensing implementation. For example, the sensing device may be a touch-sensor slider 430, or a touch-sensor button 440 (e.g., capacitance sensing button). Similarly, the operations described herein are not limited to notebook cursor operations, but can include other appropriate types of operations, such as lighting control (dimmer), volume control, graphic equalizer control, speed control or other control operations with gradual adjustments. It should also be noted that these embodiments of capacitive sensing implementations may be used in conjunction with non-capacitive sensing elements, including but not limited to pick buttons, sliders (e.g., display brightness and contrast), scroll-wheels, multi-media control (e.g., volume, track advance, and the like), handwriting recognition, and numeric keypad operation.

In one embodiment, the electronic system 400 includes a touch-sensor pad 420 coupled to the processing device 410 via bus 421. Touch-sensor pad 420 may include a multi-dimension sensor array. The multi-dimension sensor array comprises a plurality of sensor elements, organized as rows and columns. In an alternative embodiment, the electronic system 400 includes a touch-sensor slider 430 coupled to the processing device 410 via bus 431. Touch-sensor slider 430 may include a single-dimension sensor array. The single-dimension sensor array comprises a plurality of sensor elements, organized as rows, or, alternatively, as columns. In another embodiment, the electronic system 400 includes a touch-sensor button 440 coupled to the processing device 410 via bus 441. Touch-sensor button 440 may include a single-dimension or multi-dimension sensor array. The single- or multi-dimension sensor array comprises a plurality of sensor elements. For a touch-sensor button, the plurality of sensor elements may be coupled together to detect a presence of a conductive object over the entire surface of the sensing device. Alternatively, the touch-sensor button 440 has a single sensor element to detect the presence of the conductive object. In one embodiment, the touch-sensor button 440 may be a capacitive sensor element. Capacitive sensor elements may be used as non-contact switches. These switches, when protected by an insulating layer, offer resistance to severe environments.

The electronic system 400 may include any combination of one or more of the touch-sensor pad 420, touch-sensor slider 430, and/or touch-sensor button 440. In one embodiment, buses 421, 431 and 441 may be a single bus. Alternatively, these buses may be configured into any combination of one or more separate buses.

In one embodiment, touch-sensor pad 420 may be similar to the touch sensor panel described above. Touch-sensor pad 420 may include a capacitive sensor array. The array may include rows and columns of capacitive sensors designed to detect a touch in both the X and Y dimensions. The sensors may be formed from a conductive material, such as for example, ITO. The sensors may be coupled to processing device 410 using metal traces formed from a conductive material, such as for example, copper. The junction between the ITO sensor and the metal trace may be partially filled in accordance with the description herein, in order to achieve a balance between low resistance to the flow of current between the ITO and metal and preventing separation due to the different amounts of thermal expansion of the two materials.

In one exemplary embodiment, processing device 410 may be the Programmable System on a Chip (PSoC®) processing device, developed by Cypress Semiconductor Corporation, San Jose, Calif. Alternatively, processing device 410 may be one or more other processing devices known by those of ordinary skill in the art, such as a microprocessor or central processing unit, a controller, special-purpose processor, digital signal processor (DSP), an application specific integrated circuit (ASIC), a field programmable gate array (FPGA), or the like. In an alternative embodiment, for example, the processing device may be a network processor having multiple processors including a core unit and multiple microengines. Additionally, the processing device may include any combination of general-purpose processing device(s) and special-purpose processing device(s).

It should also be noted that the embodiments described herein are not limited to having a configuration of a processing device coupled to a host, but may include a system that measures the equivalent capacitance on the sensing device and sends the raw data to a host computer where it is analyzed by an application. In effect the processing that is done by processing device 410 may also be done in the host. In another embodiment, the processing device 410 is the host.

Embodiments of the method and apparatus described herein may be implemented in a fully self-contained sensing device, which outputs fully processed X/Y movement and gesture data signals or data commands to a host. In another embodiment, the method and apparatus may be implemented in a sensing device, which outputs X/Y movement data to a host, and where the host processes the received data to detect gestures. In another embodiment, the method and apparatus may be implemented in a sensing device, which outputs raw capacitance data to a host, where the host processes the capacitance data to compensate for quiescent and stray capacitance, and calculates X/Y movement and detects gestures by processing the capacitance data. Alternatively, the method and apparatus may be implemented in a sensing device, which outputs pre-processed capacitance data to a host, where the sensing device processes the capacitance data to compensate for quiescent and stray capacitance, and the host calculates X/Y movement and detects gestures from the pre-processed capacitance data. Alternatively, other configurations are possible.

The electronic system that includes the embodiments described herein may be implemented in a touch-sensor pad of a conventional laptop (e.g., notebook computer). Alternatively, it may be implemented in a wired or wireless keyboard integrating a touch-sensor pad, which is itself connected to a host. Alternatively, it may be implemented as a transparent touch screen. Alternatively, the embodiments may be implemented in a mobile handset (e.g., cellular or mobile phone) or other electronic devices where the touch-sensor pad or touch-sensor screen may operate in one of two or more modes. For example, the touch-sensor pad may operate either as a touch-sensor pad for X/Y positioning and gesture recognition, or as a keypad or other arrays of touch-sensor buttons and/or sliders. Alternatively, the touch-sensor pad, although configured to operate in the two modes, may be configured to be used only as a keypad, or only as a touch-sensor pad. Alternatively, the electronic device may be used in other applications, such as a personal data assistant (PDA), a kiosk, a keyboard, a television, a remote control, a monitor, a handheld multi-media device, a handheld video player, a handheld gaming device, or a control panel. In one embodiment, electronic system 400 is implemented in a device that includes a touch-sensor device for the user interface, such as handheld electronics, portable telephones, cellular telephones, notebook computers, personal data assistants (PDAs), kiosks, keyboards, televisions, remote controls, monitors, handheld multi-media devices, handheld video players, gaming devices, control panels of a household or industrial appliances, or the like. Alternatively, the electronic system 400 may be used in other types of devices.

It should be noted that the components of electronic system 400 may include all the components described above. Alternatively, electronic system 400 may include only some of the components described above, or include additional components not listed herein.

It should be noted that any one of various known methods for measuring capacitance may be used, for example relaxation oscillator methods, current versus voltage phase shift measurement, resistor-capacitor charge timing, capacitive bridge divider, charge transfer, successive approximation, sigma-delta modulation, charge-accumulation circuits, field effect, mutual capacitance, frequency shift, or the like.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. An apparatus, comprising:
   a first layer comprising a first conductive material having a first coefficient of thermal expansion; and
   a second layer, adjacent to the first layer, the second layer comprising a continuous body formed from a second conductive material having a second coefficient of thermal expansion, wherein the second layer is partially filled and comprises a first surface area of the continuous body formed from the second conductive material and a number of open voids extending through the continuous body to the first layer, the open voids representing a second surface area and the first layer at least partially overlapping the number of open voids in the second layer, wherein the first surface area is approximately three times greater than the second surface area.

2. The apparatus of claim 1, wherein only the first surface area of the second layer is in contact with the first layer.

3. The apparatus of claim 1, wherein the number of open voids are evenly distributed throughout the second layer.

4. The apparatus of claim 1, wherein the partially filled second layer comprises a first plurality of substantially parallel strips of the second conductive material, the second layer having a void between the first plurality of strips.

5. The apparatus of claim 4, wherein the partially filled second layer further comprises a second plurality of substantially parallel strips of the second conductive material, the second layer having a void between the second plurality of strips, wherein the second plurality of strips is oriented at a first degree of rotation in relation to the first plurality of strips.

6. The apparatus of claim 1, wherein the first conductive material comprises a transparent material.

7. The apparatus of claim 1, wherein the first conductive material comprises indium-tin-oxide (ITO) and the second conductive material comprises a metal.

8. The apparatus of claim 1, wherein the number of open voids are contained within a boundary of the continuous body.

9. A method of forming a partially filled contact between two layers of conductive material, comprising:

forming a first layer comprising a first conductive material having a first coefficient of thermal expansion; and forming a second layer, adjacent to the first layer, the second layer comprising a continuous body formed from a second conductive material having a second coefficient of thermal expansion, wherein the second layer is partially filled and comprises a first surface area of the continuous body formed from the second conductive material and a number of open voids extending through the continuous body to the first layer, the open voids representing a second surface area and the first layer at least partially overlapping the number of open voids in the second layer, wherein the first surface area is approximately three times greater than the second surface area.

10. The method of claim 9, wherein only the first surface area of the second layer is in contact with the first layer.

11. The method of claim 9, wherein the number of open voids are evenly distributed throughout the second layer.

12. The method of claim 9, wherein the partially filled second layer comprises a first plurality of substantially parallel strips of the second conductive material, the second layer having a void between the first plurality of strips.

13. The method of claim 12, wherein the partially filled second layer further comprises a second plurality of substantially parallel strips of the second conductive material, the second layer having a void between the second plurality of strips, wherein the second plurality of strips is oriented at a first degree of rotation in relation to the first plurality of strips.

14. The method of claim 9, wherein the first conductive material comprises a transparent material.

15. The method of claim 9, wherein the first conductive material comprises indium-tin-oxide (ITO) and the second conductive material comprises a metal.

16. The method of claim 9, wherein the number of open voids are contained within a boundary of the continuous body.

17. An apparatus comprising:

a processing device; and a touch sensor panel coupled to the processing device, the touch sensor panel comprising:

a sensor layer comprising a continuous body formed from formed from a transparent conductive material; and a trace layer adjacent to the sensor layer, the trace layer formed from a metal, wherein the trace layer is partially filled and comprises a first surface area of the continuous body formed from the metal and a number of open voids extending through the continuous body to the sensor layer, wherein the number of open voids are evenly distributed throughout the trace layer, wherein the open voids represent a second surface area and the sensor layer at least partially overlaps the number of open voids in the trace layer, wherein the first surface area is approximately three times greater than the second surface area, and wherein an electronic signal is passed from the sensor layer through the trace layer to the processing device, wherein the processing device identifies a touch on the touch sensor panel using the electronic signal.

18. The apparatus of claim 17, wherein the sensor layer is formed from indium-tin-oxide (ITO).

19. The apparatus of claim 17, wherein the number of open voids are contained within a boundary of the continuous body.

* * * * *